(12) United States Patent
Sezginer et al.

(10) Patent No.: US 7,506,300 B2
(45) Date of Patent: Mar. 17, 2009

(54) APPARATUS AND METHOD FOR BREAKING UP AND MERGING POLYGONS

(75) Inventors: Abdurrahman Sezginer, Los Gatos, CA (US); Roy Prasad, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 164 days.

(21) Appl. No.: 11/203,522

(22) Filed: Aug. 13, 2005

(65) Prior Publication Data

US 2006/0248499 A1 Nov. 2, 2006

Related U.S. Application Data

(60) Provisional application No. 60/676,136, filed on Apr. 29, 2005.

(51) Int. Cl.
*G06F 17/50* (2006.01)
(52) U.S. Cl. .................. 716/19; 716/2; 716/11
(58) Field of Classification Search ........... None
See application file for complete search history.

(56) References Cited

U.S. PATENT DOCUMENTS

| | | | |
|---|---|---|---|
| 4,902,899 A | | 2/1990 | Lin et al. |
| 5,242,770 A | | 9/1993 | Chen et al. |
| 5,523,186 A | | 6/1996 | Lin et al. |
| 5,680,588 A | * | 10/1997 | Gortych et al. .......... 716/19 |
| 5,900,340 A | * | 5/1999 | Reich et al. ............ 430/22 |
| 6,077,630 A | | 6/2000 | Pierrat |
| 6,114,071 A | | 9/2000 | Chen et al. |
| 6,139,994 A | | 10/2000 | Broeke et al. |
| 6,541,165 B1 | | 4/2003 | Pierrat |
| 6,634,018 B2 | | 10/2003 | Randall et al. |
| 6,668,367 B2 | * | 12/2003 | Cobb et al. ............ 716/19 |
| 6,700,095 B2 | | 3/2004 | Sandstrom et al. |

OTHER PUBLICATIONS

M. D. Levenson et al., "Improving Resolution in Photolithography with a Phase-Shifting Mask," (IEEE Transactions on Electron Devices, vol. ED-29, No. 12, pp. 1828-1836 [pp. 377-385] Dec. 1982).

Nick Cobb et al., "Mathematical and CAD Framework for Proximity Correction," (SPIE vol. 2726, p. 208-222, SPIE, Bellingham, WA, , 1996).

C. C. Paige et al., ACM Trans. Math. Software, vol. 8, No. 2 pp. 195-209, Jun. 1982.

Gill, Murray and Wright, Practical Optimization, Elsevier, 1986, p. 98-141.

(Continued)

*Primary Examiner*—Leigh Marie Garbowski
(74) *Attorney, Agent, or Firm*—Sheppard Mullin Richter & Hampton LLP

(57) ABSTRACT

A method of modifying polygons in a data set mask-less or mask based optical projection lithography includes: 1) mapping the data set to a figure-of-demerit; 2) moving individual polygon edges to decrease the figure-of-demerit; and 3) disrupting the set of polygons to enable a further decrease in the figure-of-demerit, wherein disrupting polygons includes any of the following polygon disruptions: breaking up, merging, or deleting polygons.

27 Claims, 5 Drawing Sheets

OTHER PUBLICATIONS

Kirkpatrick, S., C. D. Gelatt Jr., M. P. Vecchi, "Optimization by Simulated Annealing," Science, 220, No. 4598, pp. 671-680, 1983.

J. R. Koza, Genetic Programming: On the Programming of Computers by Means of Natural Selection, Chapter 6, Cambridge, MA: MIT Press, 1992, no page numbers.

A. K.-K. Wong, Resolution Enhancement Techniques in Optical Lithography, Chap. 4-6, (SPIE Press, vol. TT47, 2001, Bellingham, WA), p. 91-115.

W. Rudin, "Functional Analysis," Definition 10.34. Mc-Graw Hill, 1973, no page numbers.

G. H. Golub et al., Matrix Computations, Sect. 5.2, John Hopkins University Press, Baltimore, 1996, p. 210-243.

C. C. Paige et al., Algorithm 583 LSQR: Sparse Linerar Equations and Least Squares Problems, ACM Trans. Math. Software, vol. 8, No. 2, pp. 195-209, Jun. 1982.

Gill, Murray and Wright, Practical Optimization, Chapter 4. pp. 98-141, Elsevier, 1986.

Kirkpatrick, S., C. D. Gelatt Jr., M. P. Vecchi, "Optimization by Simulated Annealing," Science, 220, No. 4598, pp. 671-680, 1983.

J. R. Koza, Genetic Programming: On the Programming of Computers by Means of Natural Selection, Chap. 5-6, Cambridge, MA: MIT Press, 1992, no page numbers.

A. K.-K. Wong, Resolution Enhancement Techniques in Optical Lithography, Chap. 4, pp. 91-115, (SPIE Press, vol. TT47, 2001, Bellingham, WA).

W. Rudin, "Functional Analysis," Definition 10.34. Mc-Graw Hill, 1973, no page numbers.

G. H. Golub et al., Matrix Computations, Sect. 5.2, pp. 210-243, John Hopkins University Press, Baltimore, 1996.

* cited by examiner

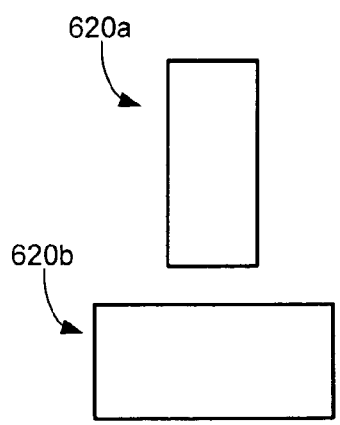 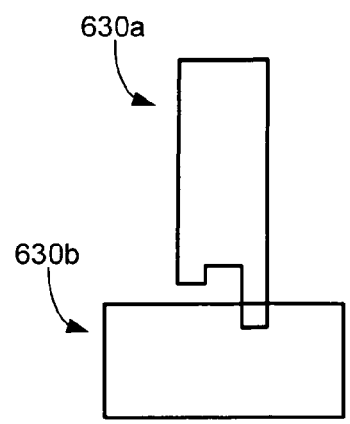 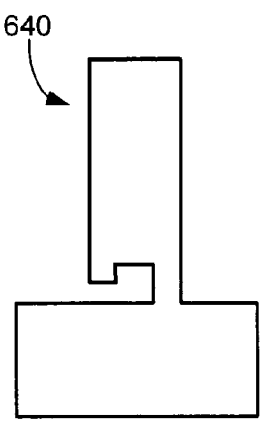
FIG. 6A   FIG. 6B   FIG. 6C
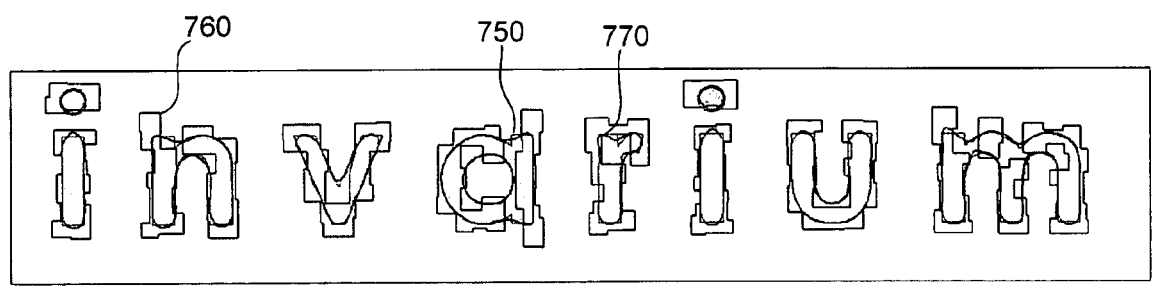
FIG. 7

APPARATUS AND METHOD FOR BREAKING UP AND MERGING POLYGONS

RELATED APPLICATIONS

This application is a continuation-in-part of U.S. patent application Ser. No. 60/676,136, entitled "Apparatus and Method for Optical Proximity Correction", filed Apr. 29, 2005, and is related to U.S. utility patent application Ser. No.:11/203,498 entitled "An Apparatus and Method for Segmenting Edges for Optical Proximity Correction", filed Aug. 13, 2005, and U.S. utility patent application Ser. No.:11/203, 505, entitled "Method and Apparatus of Model-Based Photomask Synthesis", filed Aug. 13, 2005, which related application are incorporated herein by reference as though fully set forth and which applications are also continuation-in-part application of U.S. patent application Ser. No. 60/676,136.

BACKGROUND

There have been many different kinds of methods and systems for optical proximity correction disclosed in the prior art. Nevertheless, there is a need for a new and improved apparatus and method for optical proximity correction that facilitates a more accurate and reliable optical proximity correction process as applied to integrated circuits with sub-light wavelength structures.

BRIEF SUMMARY OF THE INVENTION

The preferred embodiment of the present invention is directed to an apparatus and method of modifying polygons in a mask-less or mask based optical projection lithography data set by 1) mapping the data set to a figure-of-demerit; 2) moving individual polygon edges to decrease the figure-of-demerit; and 3) disrupting the set of polygons to enable a further decrease in the figure-of-merit, wherein disrupting polygons includes any of the following polygon disruptions: breaking up, merging, or deleting polygons.

BRIEF DESCRIPTION OF THE DRAWINGS

FIG. 6 illustrates a polygon at yet other various phases during the preferred process of the present invention; and FIG. 7 is a computed example with target polygons.

DETAILED DESCRIPTION OF THE PREFERRED EMBODIMENTS

A method of modifying polygons in a mask-less or mask based optical projection lithography data set is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
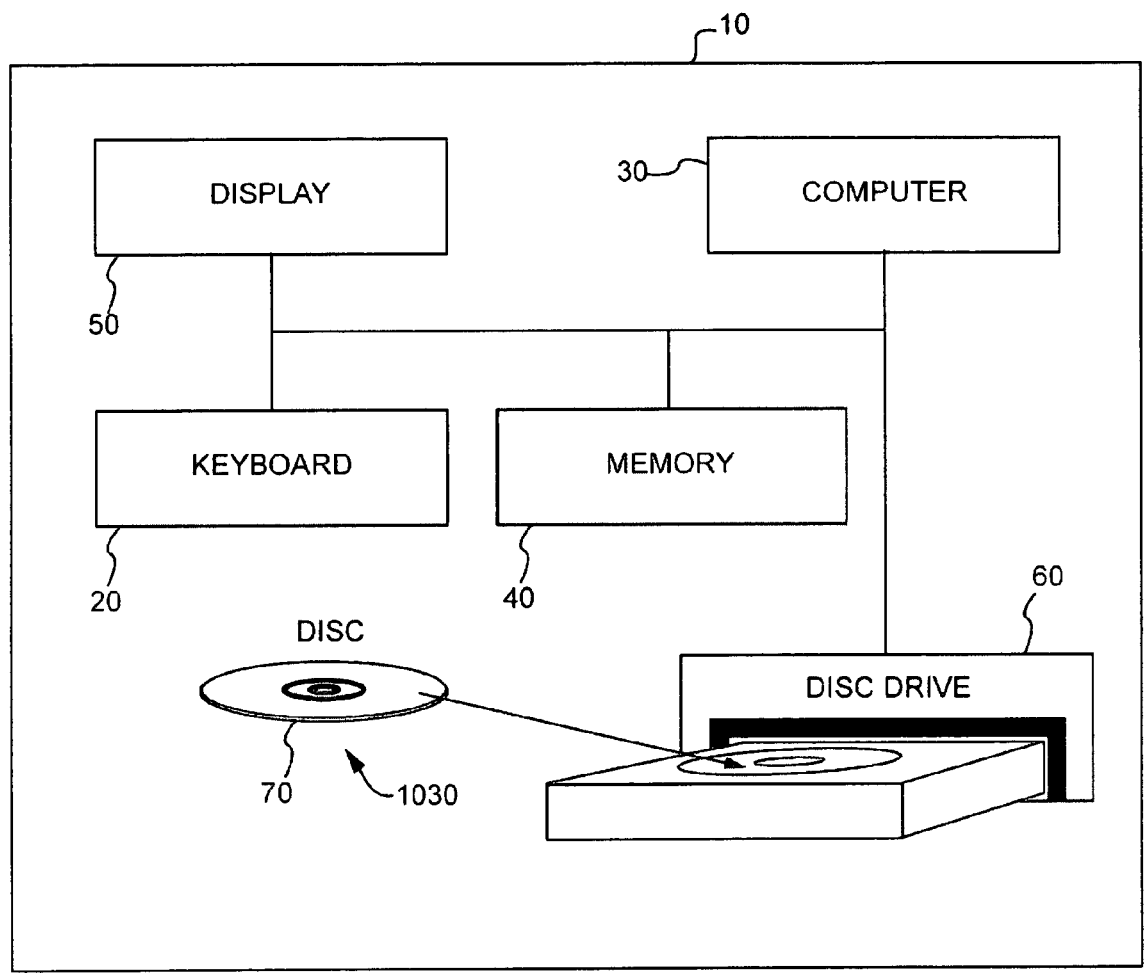
FIG. 1 is a diagrammatic illustration of a computer-aided design system, which is constructed in accordance with an embodiment of the present invention.

Referring now to the drawings and the detailed description that follows, there is illustrated in FIG. 1, an apparatus 10, which provides several different and unique methods of optical proximity correction. In one preferred embodiment of the present invention, a method 1030 of modifying polygons in a data set is provided. As will be explained hereinafter in greater detail, the method 1030 of modifying polygons in data set is provided on a computer program product 70, which is a computer usable medium that has encoded thereon computer readable codes. The computer readable codes enable a user, via the CAD system 10, to apply the method 1030 to a mask-less or mask based optical projection lithography data set. In this regard, the computer readable code causes the CAD system 10 to take the following actions:

a) to map a data set to a figure-of-demerit;
b) to move a plurality of polygon edges in the data set to reduce the figure-of-demerit; and
c) to disrupt (break up, merge, and/or delete) a subset of the polygons to further enable or facilitate decreasing the figure-of-demerit.

In some situations, after disrupting the subset of the polygons, polygon edges of the disrupted polygons may be moved to further reduce the figure-of-demerit.

Before considering the preferred embodiment of the present invention in greater detail in may be beneficial to briefly review the state of the art with reference to photomask designs and then define some of the more important terms as utilized in this disclosure document.

To begin, very large-scale integrated circuits are patterned using sub-wavelength optical lithography wherein critical dimensions of patterns are less than the wavelength of the exposing light. For example, an ArF excimer laser source of 193 nm wavelength can be used to print 65 nm-wide lines.

In sub-wavelength lithography, the pattern on the photomask is significantly distorted upon projection on to the wafer. Optical proximity correction (OPC) and resolution enhancement techniques (RET) are used to synthesize a mask pattern that will produce a predetermined target pattern on the wafer as faithfully as possible. See for example, "Resolution Enhancement Techniques in Optical Lithography", by A. K.-K. Wong, Chapters 4-6, SPIE Press, Vol. TT47, 2001, Bellingham, Wash.

A target pattern is the pattern desired on the wafer. The target pattern, a collection of polygons, is generated by circuit design, signal timing, layout, and routing considerations. OPC and RET take a target design as input and produce photomask data, which is another set of polygons.

Model-based optical proximity correction (MOPC or OPC for short) uses a computational model of the patterning process. Typically, the computational model includes a physical-optics calculation of image formation and a model of the blur caused by molecular diffusion in the photoresist. OPC algorithms start with an initial guess of the photomask data, which is expressed as a set of polygons. For binary and attenuated-PSM (attenuated phase-shift mask) masks, the initial guess is usually the same as the target pattern. OPC algorithms iteratively move edges of polygons in the photomask data in order to minimize or at least reduce some measure of the difference between the target pattern and the pattern predicted by the model.

Edges are typically subdivided into segments and the segments are moved independently. Prior-art OPC moves the edges of polygons such that disjoint polygons remain disjoint, and simply-connected polygons remain simply-connected. In short, in the prior art, a polygon does not break up into disjoint polygons, and disjoint polygons do not merge; consequently, the number of polygons and the topology of the photomask pattern is preserved during OPC. These measures are taken not because they lead to optimal OPC solutions but because they simplify preserving the circuit topology and conforming to the constraints of mask writing.

Circuit topology can be expressed as a collection of netlists (description of what is connected to what). One of the requirements of OPC is that the printed pattern should have the same circuit topology as the target pattern. Prior-art retains the same topology of a mask pattern, in each and every iteration of OPC, to ensure that the topology of the printed pattern does not change. This measure is unnecessary and it imposes an undue constraint on optical proximity correction. As will be explained hereinafter in greater detail the preferred embodiment of the present invention overcomes this undesirable constraint on optical proximity correction.

Prior-art resolution enhancement techniques (RET) include inserting sub-resolution assist features (polygons) into an initial guess of the photomask design. For example, see U.S. Pat. No. 5,242,770, by Chen et al., (1993). This is done as a separate step, prior to OPC.

Sub-resolution assist features are also known as scattering bars. They can be opaque features on a clear background, or clear features placed on an opaque background, or clear features placed on an opaque feature. Typically, sub-resolution assist features are so small, at least in one dimension, that they do not form a printed feature in photoresist, but rather help print another feature. They are typically used to increase the process window of neighboring features. In this regard, a process window refers to a region in the plane of exposure dose and defocus values in which the resulting pattern on a wafer is within design tolerances.

Inserting sub-resolution assist features increases the number of polygons in the photomask data. However, after inserting sub-resolution assist features, prior-art OPC still preserves the number of polygons while moving the edges of polygons. This aspect of the prior-art is distinct from the present invention, which teaches not preserving the topology of the polygons during OPC where doing so yields a better optical proximity correction or better process window.

Prior-art RET includes alternating-aperture phase-shift masks (AA-PSM). For example, see "Improving Resolution in Photolithography with a Phase-Shifting Mask",: by Marc D. Levenson et al., IEEE Transactions on Electron Devices, Vol. ED-29, No. 12, Dec. 1982. AA-PSM includes a first exposure with a first photomask where clear apertures on either side of a dark line are phase shifted by 180°. Phase shifting is achieved by etching the glass substrate of the photomask. A second exposure with a second mask (trim mask) is used to expose regions where spurious dark features are formed due to phase conflicts in the first mask. As a further example, see: U.S. Pat. No. 5,523,186, by Lin et al. (1996). In AA-PSM, the number of polygons on either the phase-shift mask or the trim mask is different than the number of target polygons. Phase assignment and trim apertures are produced in a step prior to OPC.

While prior-art OPC moves edges of polygons in an AA-PSM mask data set, it preserves the number and topology of the polygons. This aspect of the prior-art is distinct from the present invention, which teaches not preserving the topology of the polygons during OPC when doing so yields a better optical proximity correction or better process window.

Prior art OPC iteratively transforms the polygons in a photomask data. Whether scattering bars or phase-shift mask technology is used, the transformations of prior art OPC keep the photomask pattern topologically isomorphic from one iteration to the next (a tea cup with a handle and a donut are topologically isomorphic or homeomorphic, meaning one can be deformed into another without tearing). The present invention teaches disrupting the polygons, meaning rendering the photomask pattern not topologically isomorphic to the pattern in the previous iteration, when doing so enables meeting the design goals better.

Mask writing equipment cannot reliably produce features smaller than a certain dimension. Similarly, mask inspection equipment cannot reliably and efficiently inspect arbitrarily small features. Therefore, the diameter of a hole, the width of a line, or the space between lines cannot be smaller than a certain dimension. These rules are called mask writing rules. Currently, this dimension is on the order of 40 nm at wafer scale (the dimensions on the mask are typically 4 times larger). Prior-art OPC enforces mask rules by being overly conservative: two polygons are not allowed to approach by more than what the mask rules allow. Similarly, prior-art OPC does not allow a polygon to narrow down to a small dimension that is prohibited by the mask rules.

Several unique terms will be utilized in this specification. The following will define those terms.

Mask function m (x, y) maps the 2-dimensional (x, y) surface of the photomask to its complex-valued, local Fresnel transmission or reflection coefficient. This description includes the special case of a real-valued mask function. The mask function assigns an amplitude and a phase shift to each point (x, y) on the surface of the photomask. Usually, light that is transmitted through the photomask is projected on to a photoresist layer. In the transmission mode, the amplitude of the mask function indicates how transparent the photomask is at any point on the photomask. The larger the amplitude, the more transparent is the photomask. In some photolithography instruments, light that is reflected off a photomask is projected on to a photoresist layer. In the reflective mode, the amplitude of the mask function indicates the reflectivity of the photomask. The larger the amplitude, the more reflective is the photomask. The phase of the mask function indicates the phase shift the photomask imparts to light that is projected from a particular region of the photomask. This concept of a mask function m(x, y) is consistent with the Kirchhoff approximation (due to Gustav Kirchhoff 1824-1887) which describes diffraction as an approximately local phenomenon. A local phenomenon means, the electromagnetic field reflected by or transmitted through the mask at the point (x, y) on the photomask is influenced only by the illuminating wave and a local property m(x, y) of the mask at the same point. The local property m(x, y) is the transmission or reflection coefficient of the film stack on the photomask at point (x, y). The film stack includes any etched layer of the fused silica substrate of the photomask and thin films of materials such as $SiO_2$, TiN, MoSi, Cr deposited on the photomask. The film stack on the photomask is position-dependent since a pattern is etched on the photomask. The film stack is specified by optical refractive index, extinction coefficient, and thickness of each film, and the order of the films on the photomask. The transmission or reflection coefficient at (x, y) is calculated by assuming that the film stack at (x, y) extends endlessly in the plane of the photomask. Calculation of the transmission or reflection coefficient of a layered medium is well known (See: J. A. Kong, Electromagnetic Wave Theory, Section 3.4.C, EMW Publishing, Cambridge, Mass., 2000).

A piece-wise constant mask function is one that can be expressed as a finite summation of products of complex numbers ($m_j$) and characteristic functions $K_{Polygon_j}$ of polygonal regions ($Polygon_j$):

$$m(x, y) = \sum_{j=1}^{N_P} m_j K_{Polygon_j}(x, y) \quad (1)$$

Characteristic function $K_\Omega$ of set $\Omega$ maps the interior of $\Omega$ to 1 and the exterior of $\Omega$ to 0.

A photomask data set, synonymously called mask layout, describes a piecewise-constant mask function. A photomask data set comprises a set of polygons wherein the mask function is substantially constant in each polygon. The photomask data set comprises (x, y) coordinates of the vertices of each polygon $Polygon_j$, and the value of the mask function in the polygon or an index which determines the value of the mask function in the polygon. In Equation 1, the value of the mask function in the $j^{th}$ polygon is $m_j$, if the $j^{th}$ polygon does not intersect any other polygon.

Target pattern is the pattern we would like to form on the wafer. The target pattern is represented by a set of target polygons. Target polygons remain invariant during optimization of the photomask. Target points are points selected on the target polygons. Design goals are enforced at the target points.

Functional is a noun in mathematics. In general, a functional is a map of a topological vector space into its scalar field. In the context of this invention, a functional maps the mask function, or a photomask data set, to a real number, which serves as a figure-of-merit of the design. The figure-of-merit is a single number that measures how well a design goal, or a desired compromise between multiple goals, is met. Equivalently, a figure-of-demerit can be used which decreases as the design goals are approached. The photomask design problem is thus reduced to maximizing a figure-of-merit or minimizing a figure-of-demerit. When we mention only one of the terms: figure-of-merit and figure-of-demerit, it is understood that either formulation is possible, and that minimizing a figure-of-demerit and maximizing a figure-of-merit are equivalents of one another.

Fréchet derivative is the rate of change in the value of a functional with respect to changes in the function on which the functional operates. The Fréchet derivative of a functional F is a linear functional T (See W. Rudin, "Functional Analysis," Definition 10.34. Mc-Graw Hill, 1973) and as such, it can be represented by an inner-product with a function $$\frac{\partial F}{\partial m}:$$

$$\lim_{\|\delta m\| \to 0} \frac{F(m + \delta m) - Fm - T\delta m}{\|\delta m\|} = 0 \quad (2)$$

$$T\delta m = \left\langle \frac{\delta F}{\delta m}, \delta m \right\rangle$$

In Equation 2, $\delta m$ is an arbitrary perturbation in the mask function, the perturbation having a small norm. We shall call the function $$\frac{\delta F}{\delta m}$$

the Fréchet derivative of the functional F ignoring the distinction between a linear functional and the function that represents a linear functional.

Figure 2:
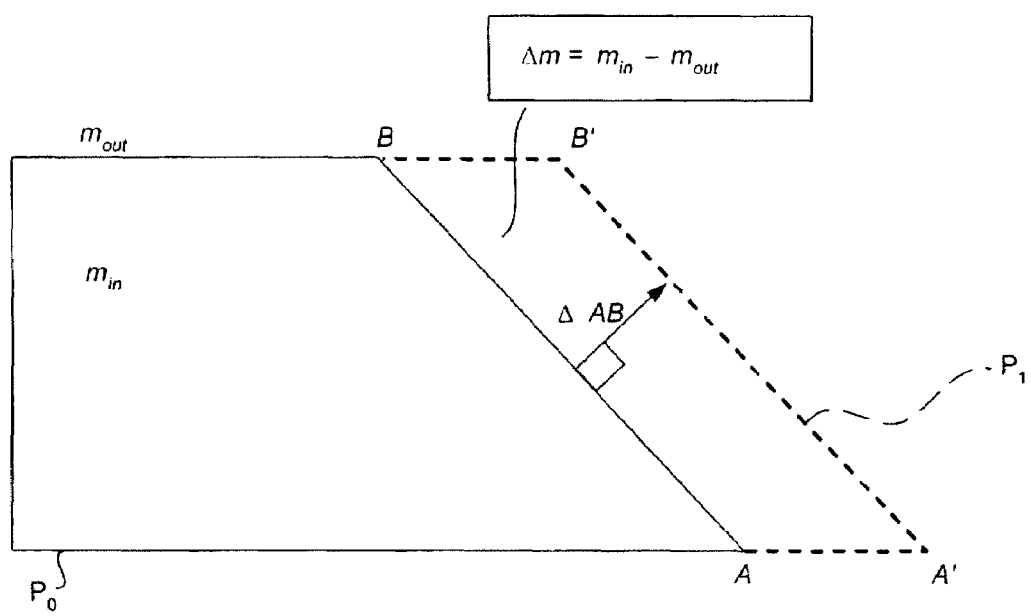
FIG. 2 is a diagrammatic illustration for helping to explain the definition of moving an edge in a polygon.

Moving an edge AB of a polygon $P_0$ refers to transforming polygon $P_0$ into another polygon $P_1$ such that: there is a one-to-one correspondence between the edges of polygon $P_0$ and the edges of polygon $P_1$; each edge of polygon $P_0$ is parallel to the corresponding edge of polygon $P_1$; the distance between AB and the corresponding edge A'B' of $P_1$ is called the edge movement $\Delta_{AB}$; and the distance between any edge of polygon $P_0$ other than AB, and the corresponding edge of polygon $P_1$, is zero. FIG. 2 shows the transformation of one polygon into another by an edge movement.

Moving edges of a polygon refers to transforming the polygon into another polygon such that the transformation is a composition of any number of transformations, wherein each transformation is moving an edge. The composition of the transformations is represented by a vector or array of edge movements, $\Delta$.

Figure 3A:
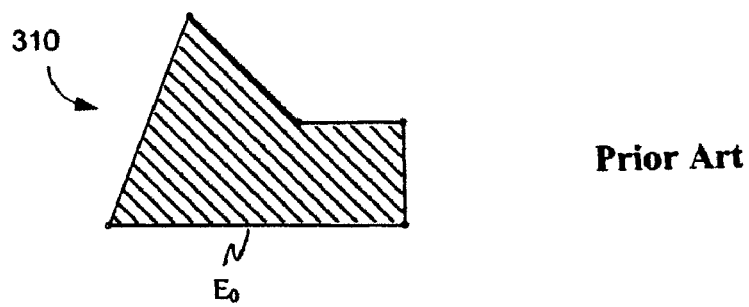
FIGS. 3A-C are diagrammatic illustrations for helping to explain the definition of segmentation of an edge of a polygon.
Figure 3B:
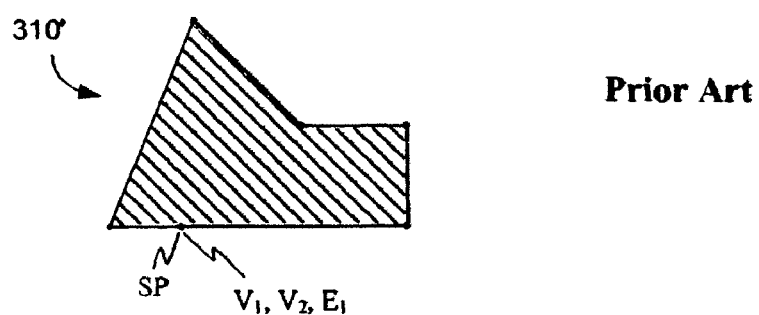
Figure 3C:
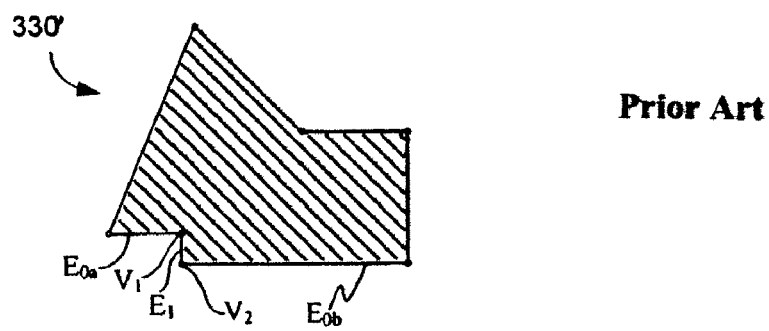

Segmenting an edge of a polygon 310 refers to transforming the polygon 310 into another polygon 310' with a larger number of vertices. Referring to FIG. 3, segmenting comprises inserting two overlapping vertices $V_1$ and $V_2$, between which is an edge of zero-length $E_1$, at a segmentation point SP on an edge $E_0$ of the polygon 310. Immediately after segmentation, the segmented polygon 310' has at least four colinear vertices and at least two overlapping vertices ($V_1$ and $V_2$). Segment or edge segment is synonymous with "edge" of a polygon. Segment usually refers to edges created by segmenting an edge, such as $E_{0a}$, $E_{0b}$, and $E_1$. The segmented polygon 310' is usually further transformed by moving its edges, as illustrated in FIG. 3C to form polygon 330'. The purpose of segmenting the edges of a polygon is to increase the degrees of freedom by which the polygon can be transformed into another polygon.

The target pattern, mask layout, and the pattern printed on the wafer (wafer pattern) are distinct objects. The target points used for enforcing design goals are on the target polygons. The target polygons and target points are invariant during iterations of photomask synthesis. The edges of the polygons in the mask layout are segmented and moved. The segmentation points have no relation to the target points.

The discussion that follows will make reference to photomasks. However, the present invention also applies to mask-less lithography. In mask-less optical projection lithography, the photomask is replaced by a spatial light modulator. The spatial light modulator has an array of pixels each of which can modulate light that falls on it. The pixels are controlled according to the photomask data. The spatial light modulator typically comprises an array of micro-machined mirrors. The spatial light modulator is illuminated and its image is projected by an objective on to the wafer. See for example, U.S. Pat. No.: 6,700,095 by Sandstrom, et al., (2004). In view of the foregoing, in the discussion that follows, the terms "photomask data" set and "mask layout" are used synonymously and they are understood to include "mask-less lithography data set."

Considering now a method of synthesizing mask data, MOPC moves edges of polygons in a photomask data set so that the pattern that is transferred to the wafer by lithography is as close as possible to a target pattern. An essential ingredient of model-based lithography is a computational model of the patterning process. The intensity of the latent image in a photoresist film deposited on a wafer can be expressed as:

$$I(x, y; z) = \sum_{n=1}^{N} \mu_n \left| \iint V_n^*(x'-x, y'-y; z) m(x', y') dx' dy' \right|^2 \quad (3)$$

(See: N. Cobb et al., "Mathematical and CAD Framework for Proximity Correction," Proc. SPIE Vol. 2726, p. 208, 1996) In Equation 3, which is derived from the Kirchhoff approximation, $\mu_1, \mu_2, \ldots, \mu_N$ are positive-valued eigenvalues and $V_1^*, V_2^*, \ldots, V_N^*$ are complex conjugates of eigenfunctions of a Hermitian, positive-semidefinite operator; and m(x,y) is the complex transmission coefficient of the mask at the point (x,y). For binary masks, m(x,y)=1 in clear areas, and m(x,y)=0 in opaque areas. In 180° phase-shifted windows on the photomask, m(x,y)=−1. In general, in a φ-radian phase-shifted window, m(x,y)=$e^{i\phi}$. For an attenuated phase-shift feature with power transmission coefficient T, the mask function takes the value: m(x,y)=$e^{i\phi}\sqrt{T}$ wherein the nominal value of the phase shift is: φ=π. For reflective masks, m(x,y) is the complex reflection coefficient of the mask at the position (x,y). The focus variable z, denotes the position of the wafer with respect to best focus. The variable z is not to be confused with the vertical position inside the photoresist.

The goals of a photomask design are encapsulated in a real-valued figure-of-merit, or equivalently in a figure-of-demerit, which is calculated using the results of the computational model of the patterning process. A photomask design problem thus, becomes equivalent to minimizing a figure-of-demerit or maximizing figure-of-merit.

The goals of photomask design include one or more of:
1) placing the edges of the printed pattern at the corresponding edges of a target pattern;
2) maximizing the image contrast at the resist edges thereby increasing the exposure dose latitude and immunity to flare;
3) maximizing the depth of focus, i.e., enforcing 1) and 2) for a range of focus values.

The first and last goals can be achieved by minimizing a functional $F_1 m$ with respect to lithography data (mask transmission function) m:

$$F_1 m = \sum_{q=1}^{Q} \sum_{j=1}^{M} (I(x_j, y_j; z_q) - t)^2 \quad (4)$$

$F_1$ is a functional that maps a mask transmission function m to a non-negative real number, which is a figure-of-demerit. In Equation 4, t denotes a threshold, which is equal to the ratio: (dose-to-clear/dose), where "dose" refers to the light exposure dose (energy per unit area) applied to a photoresist, and "dose-to-clear" indicates the minimum dose necessary to clear a positive photoresist or not clear a negative photoresist. Accordingly, a positive photoresist dissolves if $I(x_j,y_j;z_q)$>t, and it does not dissolve if $I(x_j,y_j;z_q)$<t at the location $(x_j,y_j)$ on the wafer when the defocus is $z_q$. The inequalities are reversed for a negative photoresist. Since the squared terms in Equation 4 are summed over target points $(x_j,y_j)$; j=1, . . . , M and focus values $z_1, \ldots, z_Q$, resist edges go through all M target points, for all Q focus values if and only if $F_1 m$=0. In practice, $F_1 m$=0 is usually not feasible; therefore, the photomask is designed by minimizing $F_1 m$. This description embodies the special case Q=1 where Equation 4 is evaluated for a single focus value, such as the best focus, z=0.

Using a single focus value reduces the computation time. The target points are points selected on the edges of the target polygons. The image intensity is band-limited with a Nyquist sampling rate of 0.25λ/NA, where λ is the exposure wavelength and NA is the numerical aperture. Since the image is band-limited, placing the target points arbitrarily densely increases computational time with little benefit. A preferred value for the spacing of target points on an edge is ~0.2λ/NA. Not placing target points on corners of target polygons is good practice since resist edge cannot have sharp corners.

All three of the previously mentioned goals may be achieved by minimizing $F_2 m$ with respect to lithography data (mask transmission function) m:

$$F_2 m = \sum_{q=1}^{Q} \sum_{j=1}^{M} \frac{(I(x_j, y_j; z_q) - t)^2 + \alpha}{\left( tol_j \frac{\partial I}{\partial n}(x_j, y_j; z_q) \right)^2} \quad (5)$$

$F_2$ is a functional that maps a mask transmission function m to a non-negative real number, which is a figure-of-demerit. Minimizing $F_2 m$ forces the resist edge to go through the target points $(x_j,y_j)$; j=1, . . . , M for focus values $z_1, \ldots, z_Q$. The image-slope $$\frac{\partial I}{\partial n}(x_j, y_j; z_q)$$

is the directional derivative of the image in the direction that is perpendicular to the target edge. The following term is a first-order estimate of the edge-placement error (EPE):

$$EPE_{j,q} \equiv \text{Edge placement error at } (x_j, y_j; z_q) = \frac{I(x_j y_j; z_q) - t}{\frac{\partial I}{\partial n}(x_j, y_j; z_q)} \quad (6)$$

The edge placement error is normalized with the edge placement tolerance $tol_j$ for the $j^{th}$ target point:

$$\text{Relative edge placement error at } (x_j, y_j; z_q) = \frac{I(x_j, y_j; z_q) - t}{tol_j \frac{\partial I}{\partial n}(x_j, y_j; z_q)} \quad (7a)$$

Edge placement error depends on the exposure dose. If the exposure dose is increased by Δdose, such that Δdose/dose<<1, then the edge placement error changes as follows:

$$EPE_{j,q}(\Delta\text{dose}) = \frac{I(x_j, y_j; z_q) - \left(1 - \frac{\Delta\text{dose}}{\text{dose}}\right) t}{\frac{\partial I}{\partial n}(x_j, y_j; z_q)} \quad (7b)$$

If the sum of $[EPE_{jq}^2(+\Delta dose)+EPE_{jq}^2(-\Delta dose)]/tol_j^2$ over all target points is minimized, then the figure-of-demerit $F_2m$ in Equation 5 is derived as follows:

$$F_2m = \sum_{q=1}^{Q}\sum_{j=1}^{M}\frac{(I(x_j,y_j;z_q)-t)^2+\left(\frac{\Delta dose}{dose}t\right)^2}{\left(tol_j\frac{\partial I}{\partial n}(x_j,y_j;z_q)\right)^2} \quad (7c)$$

This determines the value of the parameter $\alpha$ as:

$$\alpha = \left(\frac{\Delta dose}{dose}t\right)^2 \quad (7d)$$

As an alternatively approach, the figure-of-demerit $F_2m$ in Equation 5 is achieved by introducing edge-displacement (ED) induced by dose-variation:

$$ED_{j,q}(\Delta dose) \equiv \text{Edge displacement induced by dose} \quad (7e)$$
$$\text{variation at } (x_j, y_j; z_q)$$
$$= \frac{\frac{\Delta dose}{dose}t}{\frac{\partial I}{\partial n}(x_j,y_j;z_q)}$$

If the sum of $[EPE_{jq}^2+ED_{jq}^2(\Delta dose)]/tol_j^2$ over all target points is minimized, then again the figure-of-demerit $F_2m$ in Equation 5 is derived, with the value of the parameter $\alpha$ given by Equation (7d).

Minimizing a sum-of-squares as indicated by Equation 4 or Equation 5 is convenient for optimization because it leads to a figure-of-demerit that is continuously differentiable with respect to the movements of the polygon edges or with respect to the value of the mask function in any neighborhood. Many other formulations of figure-of-demerit can be used although they are not preferred. Some examples of alternative figure-of-demerit formulations are given as follows:

$$F_3m = \max_{j,q}\frac{EPE_{jq}}{tol_j} \quad (7f)$$

$$F_4m = \sum_{q=1}^{Q}\sum_{j=1}^{M}\frac{|EPE_{jq}|+|ED(\Delta dose)|}{tol_j} \quad (7g)$$

By virtue of having the image slope in the denominator, minimizing the figure-of-demerit $F_2m$ enforces having a high image contrast at each target point. The optional, positive parameter $\alpha$ in the numerator of Equation 5 is used to emphasize the requirement of large image slope at the edges of the target polygons.

A high image slope increases the dose latitude and decreases the sensitivity of the printed pattern to lens flare (scattered light). The terms in Equation 5 are summed over the target points and over a few focus settings $z_1, z_2, \ldots, z_Q$. Typically using two focus settings such as z=0 (best focus) and z=(depth of focus)/2 is sufficient. A single focus value such as the best focus z=0 may be used to reduce the computation time.

Minimizing $F_m$ forces the resist edge to go through the target points but that does not preclude presence of resist edges where there are no target points. Without additional constraints, minimizing the figure-of-demerit in Equation 4 or Equation 5 can result in spurious resist features in large clear areas, away from the target points. It can also cause spurious holes in large resist areas away from the target points. Additional constraints may be needed when the target pattern has large clear or large opaque features:

$I(x_j^{(c)},y_j^{(c)};z_q) \geq t_U > t$ for $(x_j^{(c)},y_j^{(c)})$ in clear areas and opaque assist features $I(x_j^{(c)},y_j^{(c)};z_q) \leq t_L < t$ for $(x_j^{(c)},y_j^{(c)})$ in opaque areas and clear assist features (8)

Control points $(x_j^{(c)},y_j^{(c)})$ are placed where resist edges are not wanted; that is, anywhere other than the edges of the target polygons. In particular, control points may be placed on assist features and in between features where the process window is likely to be narrow. Constraint Equation 8 assumes a positive photoresist. For negative photoresists, the words opaque and clear are to be interchanged. The intensity safety margins $t^U$ and $t_L$ are determined by the desired dose latitude. Typical spacing of the control points is $0.25\lambda/NA$. The functional $F_1m$ or $F_2m$ is minimized subject to the constraints Equation 8.

The image intensity at a point is a quadratic functional of the mask function according to Equation 3. The figure-of-demerit in turn is a simple function (quadratic in the case of Equation 4 and rational polynomial in the case Equation 5) of the intensity. The variation of the figure-of-demerit in Equation 4 with respect to changes in the mask function is:

$$\frac{\delta F_1m}{Re\delta m}(x'',y'') = \quad (9)$$
$$4\sum_{q=1}^{Q}\sum_{j=1}^{M}(I(x_j,y_j;z_q)-t)\sum_{n=1}^{N}\mu_n Re\{Q_{nj}V_n^*(x''-x_j,y''-y_j;z_q)\}$$

$$\frac{\delta F_1m}{Im\delta m}(x'',y'') =$$
$$-4\sum_{q=1}^{Q}\sum_{j=1}^{M}(I(x_j,y_j;z_q)-t)\sum_{n=1}^{N}\mu_n Im\{Q_{nj}V_n^*(x''-x_j,y''-y_j;z_q)\}$$

$$Q_{nj} = \int\int V_n(x'-x_j,y'-y_j;z)m^*(x',y')dx'dy'$$

The first and second line in Equation 9 express the rate of change of the figure-of-demerit with respect to the real and imaginary parts of the mask function, respectively, at an arbitrary point $(x'',y'')$ on the mask. The Fréchet derivative in Equation 9 indicates how to alter the phase and amplitude of the mask function at any point on the mask in order to decrease the figure-of-demerit. This provides a rigorous method by which sub-resolution halftoning can be applied to approach the design goals.

Moving an edge AB of a polygon, such as the polygon $P_0$ by an amount $\Delta_{AB}$ to A'B', as shown in FIG. 2, changes the value of the mask function only in the region AA'B'B. For a piecewise-constant mask function, the value of the mask function at any point in AA'B'B changes by:

$\Delta m = m(\text{inside } P_0) - m(\text{outside } P_0)$ (10)

Consider an infinitesimal segment of an edge, the segment that is centered at $(x'',y'')$ and of length dl. The derivative of the figure-of-demerit with respect to the movement $\Delta$ of the infinitesimal segment per segment length is:

$$\Psi(x'', y'') \equiv \frac{\partial F_1 m}{dl \partial \Delta} \quad (11)$$

$$= 4 \sum_{q=1}^{Q} \sum_{j=1}^{M} (I(x_j, y_j; z_q) - t) \sum_{n=1}^{N} \mu_n$$

$$\text{Re}\{\Delta m(x'', y'') Q_{nj} V_n^*(x'' - x_j, y'' - y_j; z_q)\}$$

The function $\Psi$, defined on the edges of polygons in a mask layout, is the point-wise sensitivity of the figure-of-demerit to the movement of a point on a polygonal edge. The derivative of the figure-of-demerit with respect to the movement $\Delta_{AB}$ of the entire edge AB as one unit is:

$$\frac{\partial F_1 m}{\partial \Delta_{AB}} = \int_{AB} \Psi(x'', y'') dl'' \quad (12)$$

$$= 4 \sum_{q=1}^{Q} \sum_{j=1}^{M} (I(x_j, y_j; z_q) - t) \sum_{n=1}^{N} \mu_n$$

$$\int_{AB} \text{Re}\{\Delta m(x'', y'') Q_{nj} V_n^*(x'' - x_j, y'' - y_j; z_q)\} dl''$$

The line-integral above is taken over the edge AB. The double prime on dl" indicates the variables of integration are (x",y"). The derivative of the figure-of-demerit $F_2m$ in Equation 5 is calculated in a similar manner.

An array (vector) of available edge movements is designated as array $\Delta$ (vector $\Delta$). Some edges in the mask layout may not be movable; in which case, they are excluded from the array $\Delta$. For example, edges that have been optimized in a previous process may be marked as not movable in a subsequent process. The design of the mask layout is reduced to minimizing a figure-of-demerit such as $F_1m$ in Equation 4 or $F_2m$ in Equation 5 with respect to the vector $\Delta$. Standard techniques of optimization, such as the Gauss-Newton algorithm (See: Gill, Murray and Wright, Practical Optimization, Elsevier, 1986) can be used to minimize or at least reduce the figure-of-demerit. Explicitly calculating the derivative of the figure-of-merit, as in Equation 12, makes the numerical implementation of the optimization algorithm more efficient.

To describe the use of the Gauss-Newton algorithm in this context, a vector-valued, multi-variate function $f(\Delta)$ is introduced. In the case of the figure-of-demerit defined by Equation 4, the j, $q^{th}$ entry of vector $f(\Delta)$ is:

$$f_{jq}(\Delta) = I(x_j, y_j; z_q) - t \quad (13)$$

The function $f: R^N \mapsto R^{QM}$ maps $\Delta \in R^N$, the array of N edge movements, into a vector of QM real numbers. M is the number of target points; and Q is the number of focus values, which can be 1. Similarly, for the figure-of-demerit defined by Equation 5, the j, $q^{th}$ entry of vector $f(\Delta)$ is:

$$f_{jq}(\Delta) = \frac{I(x_j, y_j; z_q) - t}{tol_j \frac{\partial I}{\partial n}(x_j, y_j; z_q)} \text{ for } \alpha = 0 \quad (14)$$

For convenience, the two indices of $f_{jq}(\Delta)$ are collapsed into one. In other words, the intent is to re-arrange $f(\Delta)$ into a column-vector and refer to the $p^{th}$ entry of this column vector as $f_p(\Delta)$. A Jacobian matrix J is defined by:

$$J_{pq}(\Delta) \equiv \frac{\partial f_p}{\partial \Delta_q} \quad (15)$$

$$= \sum_{n=1}^{N} \mu_n \int_{AB} \text{Re}\{\Delta m(x'', y'') Q_{nj} V_n^*$$

$$(x'' - x_j, y'' - y_j; z_q)\} dl''$$

Unconstrained minimization of the figure-of-demerit by the Gauss-Newton algorithm leads to the following iteration, where the superscript$^{(n)}$ is the iteration index:

$$J(\Delta^{(n)})[\Delta^{(n)} - \Delta^{(n+1)}]^{LSQ} = f(\Delta^{(n)}) \quad (16)$$

The linear Equation 16 is solved in the least-squares sense, taking into account the possibility that the rank of the matrix $J(\Delta^{(n)})$ can be less than the number of its columns to working precision. In that case, Equation 16 needs to be regularized, which can be done by the singular value decomposition or QR-factorization of $J(\Delta^{(n)})$, [See for example, G. H. Golub, C. F. Van Loan, Matrix Computations, Sect. 5.2, John Hopkins University Press, Baltimore, 1996] or by solving:

$$\Delta^{(n)} - \Delta^{(n+1)} = [J^T J + \epsilon I]^{-1} J^T f(\Delta^{(n)}) \quad (17)$$

In Equation 17, $\epsilon$ is a small, positive regularization parameter and I is the identity matrix. The method of Equation 17 is not preferred because it is inefficient. A preferred method of solving Equation 16 is the least-squares algorithm as described in an article by C. C. Paige and M. A. Sunders, ACM Trans. Math. Software, Vol. 8, No. 2, June 1982, p. 195-209, which is hereby incorporated by reference in its entirety as though fully set forth herein.

Equation 16 is iterated until the figure-of-demerit is sufficiently small, or $\Delta^{(n)}$ ceases to change significantly, or a predetermined number of iterations or computation time is reached.

Considering now the method 1030 of disrupting polygons in greater detail, in prior-art OPC moves the edges of polygons such that disjoint polygons remain disjoint, simply-connected polygons remain simply-connected, a polygon does not break up into more than one disjoint polygon, and the number of polygons is preserved. These measures are taken not because they lead to good OPC solutions but because they simplify preserving circuit topology. This constraint is not necessary to preserve circuit topology.

Figure 4A:
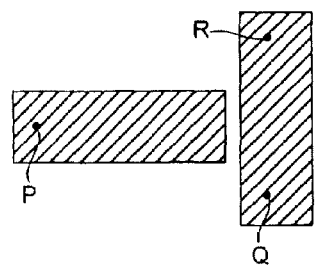
FIGS. 4A-B are diagrammatic illustrations of mask data and a wafer pattern.
Figure 4B:
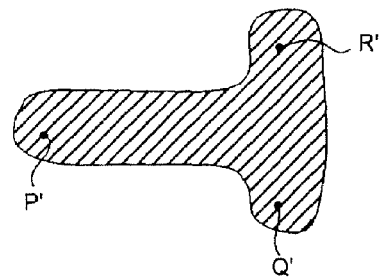

Considering now an example with reference to FIG. 4, in FIG. 4B, points P',Q',R' in a wafer pattern need to be electrically connected for a circuit to operate properly. The points P',Q',R' are images of the points P,Q,R (FIG. 4A) in the mask data. That the points P',Q',R' are connected on the wafer does not mean that P,Q,R should lie on one polygon or a union of overlapping polygons in the mask data. Imposing such a requirement adversely constrains OPC, that is, the minimization of the figure-of-demerit in Equation 4 or 5.

Figures 5A, 5B, 5C:
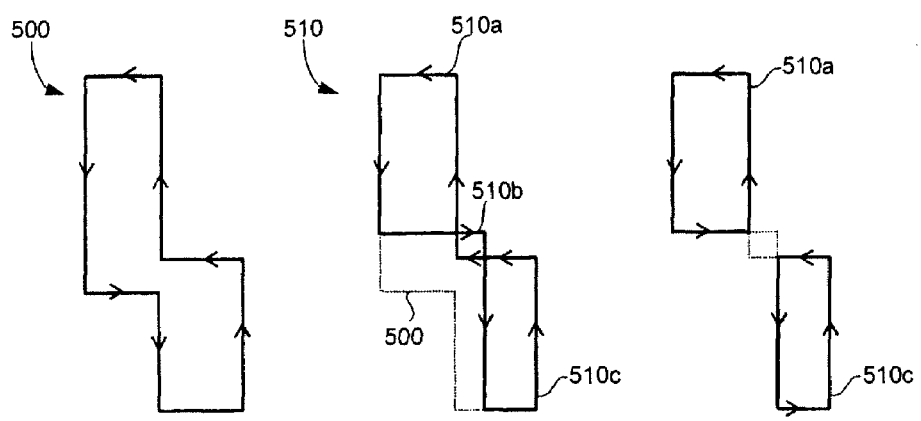
FIGS. 5A-C illustrate a polygon at various phases during the preferred process of the present invention.

The overall preferred method comprises these steps:
1. Defining a set of target polygons (the pattern to be formed on the wafer);
2. Initializing mask data set by generating a set of polygons with movable edges; and optionally inserting sub-resolution assist features and/or phase shifted features into the mask data set (The initial guess can be the same as the target polygons for attenuated-PSM and binary masks. Edges of the polygons in the initial guess can be further segmented to increase the number of degrees of freedom);

3. Moving the edges of the polygons that make up the mask data in order to approach the design goals. This is done by minimizing a figure-of-demerit that encapsulates the design goals. The step to minimize the figure-of-demerit is taken by solving Equation 16 in the least squares sense;
4. If the figure-of-demerit does not decrease as a result of step 3, reducing the step size by either scaling down the vector $\Delta^{(n)-\Delta(n+1)}$, that is backtracking on a line; or by increasing the parameters in Equation 16, until the figure-of-demerit decreases;
5. Breaking up polygons that intersect themselves after Step 4 as illustrated in FIG. 5;
6. Merging polygons that intersect each other after Step 4 as illustrated in FIG. 6;
7. Assigning a new vector of edge-movement variables to the edges of the polygons at step 6. The number of movable edges can change when the polygons are broken or merged;
8. Repeating steps 3 to 7 until the design goals are reached, or a maximum allowable number of iterations or computation time is reached.

FIG. 5 illustrates a polygon 500 at the beginning of Step 3. At the end of Step 4, polygon 500 is deformed into a new polygon 510 as a result of the edge movements in Steps 3 and 4. Polygon 510 is self-intersecting. Polygon 510 can be broken into sub-polygons 510*a*, 510*b*, and 510*c*. At step 5, sub-polygon 510*b* is deleted.

FIG. 6 shows polygons 620*a* and 620*b* at the beginning of Step 3. After Step 4, polygons 620*a* and 620*b* change into polygons 630*a* and 630*b* as a result of the edge movements. Polygons 630*a* and 630*b*, which intersect, are merged into one polygon 640 at Step 6. Prior art OPC prohibits two disjoint polygons encroaching on each other in order to satisfy mask manufacturability rules. This puts an undue constraint on OPC. Merging the polygons can also satisfy mask constraints, and in some instances it can lead to a better OPC solution.

Numerical Example: FIG. 7 shows a computed example with target polygons 750. Steps 1-8 yield mask pattern 760. The polygons that make up the pattern 760 of letters n, a, and m were broken up at Step 5. The lettering in this example has a line width of 65 nm. The calculation assumed an exposure wavelength of 193 nm, numerical aperture of 0.93, annular illumination with $\sigma_{in}=0.575$ and $\sigma_{out}=0.875$, an attenuated phase-shift mask with a power transmission coefficient of 8%, and a photoresist blur of $\sigma=25.45$ nm.

Alternative Embodiments: The design goals of OPC are encapsulated in the minimization of a figure-of-demerit such as in Equation 4 or 5. It should be noted that it is possible to equivalently maximize a different expression since minimizing x is equivalent to maximizing 1/x or −x. Equation 16 is the update step of the algorithm known as Gauss-Newton minimization algorithm. Using Gauss-Newton minimization is not essential to this invention. Any technique of minimization can be employed at step 3 such as: steepest-descent, quasi-Newton, Gauss-Newton, Levenberg-Marquardt, conjugate-gradient, or Newton's method of minimization (See: Gill, Murray and Wright, Practical Optimization, Elsevier, 1986). Simulated annealing (Kirkpatrick, S., C. D. Gelatt Jr., M. P. Vecchi, "Optimization by Simulated Annealing," Science, 220, No. 4598, pages 671-680, 1983) and genetic algorithms (Koza, J. R. Genetic Programming: On the Programming of Computers by Means of Natural Selection. Chapter 6, Cambridge, Mass.: MIT Press, 1992) may also be used for minimizing the figure-of-demerit. The invention is equally valid for transmissive and reflective masks such as the ones used in extreme ultra-violet (EUV) lithography. The concept of breaking up self-intersecting polygons is applicable to binary, attenuated-PSM, alternating aperture-PSM, chrome-less phase-shift lithography (CPL), multi-tone and multi-phase masks. In the example of FIG. 5, if polygons 500 and 510 are clear windows on an opaque background, a preferred alternative to removing polygon 510*b* is to change its phase by 180°. This invention is applicable to mask-less lithography data.

Considering now the computer program product 70 in greater detail with reference to FIG. 1, the computer program product 70 is a computer usable medium that has encoded thereon computer readable codes. The computer readable codes enable a user, via the CAD system 10, to implement an optical proximity correction and more specifically a method of photomask design that breaks up and merges polygons in a lithographic process. In this regard, the computer program product 70 has encoded thereon computer readable program code that causes the computer 30 in one preferred method to modify a photomask or mask-less lithography data set, which comprises polygons. In this method, the process 1030 causes the CAD system 10 to take the following steps:
 1) move edges of polygons contained in the photomask data set; and
 2) break a polygon into disjoint polygons and/or merge polygons and/or delete a polygon in the photomask data set.
 3) steps 1 and 2 are then iteratively repeated.

In another preferred method of making optical proximity corrections to a photomask data set, the computer program product 70 has encoded thereon computer readable program code 1030 that causes the computer 30 to perform the steps of:
 1) moving edges of polygons contained in the photomask data set;
 2) checking if breaking a polygon into disjoint polygons and/or merging polygons and/or deleting a polygon in the photomask data set brings a printed circuit pattern closer to a specific design goal;
 3) breaking a polygon into disjoint polygons and/or merging polygons and/or deleting a polygon in the photomask data set as determined in step 2; and
 4) repeating steps 1), 2), and 3) iteratively.

In still yet another preferred method of making optical proximity corrections to a photomask data set, a user begins the processing by first providing a computation model of a patterning process and then a mathematical statement of a design goal. Once the user has set up this initial parameter information, the computer program product 70, which has encoded thereon computer readable program code 1030, is loaded into the computer 30 to cause the computer 30 to perform the steps of:
 1) moving edges of polygons contained in a photomask data set according to the computational model in a way to approach or meet the design goal;
 2) breaking a polygon into disjoint polygons and/or merging polygons and/or deleting a polygon in the photomask data set; and
 3) iteratively repeating steps 1) and 2).

In the last mentioned method 1030, the step of moving edges of polygons according to the computational model in a way to approach or meet the design goals comprises an optimization algorithm, wherein the optimization algorithm is a method of convex optimization, or simulated annealing, or a genetic algorithm. It should also be understood that the optimization algorithm seeks to minimize or at least reduce a difference between a pattern predicted by the computational model and a target pattern. In this regard, the optimization algorithm seeks to maximize one or any combinations of: dose-latitude, depth-of-focus, and immunity to flare.

In summary then, a new and novel method of disrupting polygons by breaking up, merging, or deleting them has been described, and which method can be applied to modify a photomask or mask-less lithography data set (comprised of a set of polygons). The order of the steps applied in this new and novel method is significant. That is, as a first step the edges of the polygons in the data set are moved, and then as a second step, if required, the method proceeds to disrupt the polygons; e.g. break a polygon into disjoint polygons and/or merge polygons and/or delete one or more of the polygons in the data set. The steps of moving and disrupting are iteratively repeated to achieve a design goal or computational end, based on time or a number of iterations. In the prior art OPC, the photomask pattern at each iteration is topologically isomorphic to the pattern in the previous iteration. The disclosed method is not so constrained.

In the preferred embodiment, the computer readable code has been described as being encoded on a disc 70 that can be entered into the computer memory 40 by the disc drive 22, which reads and transfers the code under computer control. However, it is contemplated that the code could be entered remotely from another computer, through a high speed cable or satellite connection, or directly from or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

We claim:

1. A method of modifying polygons in a data set, where each polygon in the data set has a plurality of edges, comprising:
    mapping the data set to a figure-of-demerit;
    moving said edges to reduce said figure-of-demerit; and
    disrupting said set of polygons to enable a further reduction of said figure-of-demerit, wherein said step of disrupting includes any of the following: breaking up polygons; merging polygons; deleting polygons.

2. The method of modifying polygons according to claim 1, further comprising: using the modified polygon set in a mask-less optical projection lithography process.

3. The method of modifying polygons according to claim 1, further comprising: using the modified polygon set to make a lithography photomask.

4. The method of modifying polygons according to claim 1, further comprising:
    moving edges of disrupted polygons to further reduce said figure-of-demerit after said step of disrupting.

5. The method of modifying polygons according to claim 4, further comprising:
    repeating the last mentioned steps of disrupting and moving.

6. The method of modifying polygons in a data set according to claim 1, wherein said step of mapping the data set to a figure-of-demerit includes using a computational model of a patterning process which substantially predicts at least one of the following:
    a mask writing proximity effect;
    a fogging effect in mask writing;
    a mask etch effect; an optical imaging effect;
    a photoresist blur effect; a photoresist develop effect; and
    a wafer etch effect.

7. The method of modifying polygons in a data set according to claim 6, further comprising: calculating a measure of difference between a pattern predicted by said computational model and a desired target pattern.

8. The method of modifying polygons in a data set according to 7, wherein said step of calculating a measure of difference between a pattern predicted by said computational model and a desired target pattern is performed for more than one exposure dose.

9. The method of modifying polygons in a data set according to 7, wherein said step of calculating a measure of difference between a pattern predicted by said computational model and a desired target pattern is performed for more than one defocus value.

10. The method of modifying polygons in a data set according to 7, wherein said step of calculating a measure of difference between a pattern predicted by said computational model and a desired target pattern is performed for more than one exposure dose and more than one defocus value.

11. The method of modifying polygons in a data set according to claim 6, further comprising: calculating a measure of image slope.

12. The method of modifying polygons in a data set according to claim 6, further comprising: calculating a measure of image contrast.

13. The method of modifying polygons in a data set according to claim 6, further comprising:
    calculating a difference in the pattern predicted by said computational model; wherein the difference is in response to a change in the exposure dose.

14. The method of modifying polygons in a data set according to claim 6, further comprising:
    calculating a difference in the pattern predicted by said computational model; wherein the difference is in response to a change in the defocus.

15. The method of modifying polygons in a data set according to claim 6, further comprising: calculating a difference in the pattern predicted by said computational model wherein the difference is in response to both a change in the exposure dose and a change in the defocus.

16. A method of modifying polygons in a data set according to claim 1, further comprising: inserting sub-resolution assist features in the data set prior to said step of moving.

17. A method of modifying polygons in a data set according to claim 1, further comprising: assigning phase shifts to some of the polygons prior to said step of moving.

18. A method of modifying polygons in a mask data set, comprising:
    providing a mask layout defined by a plurality of polygon edges;
    providing a computational model that predicts a patterning process;
    defining a set of design goals; mapping said mask layout to a figure-of-demerit that quantifies how far said mask layout is from satisfying said set of design goals;
    reducing said figure-of-demerit iteratively by moving polygon edges; and
    merging, deleting, or breaking up polygons.

19. The method of modifying polygons in a mask data set according to claim 18, wherein said step of reducing is performed by an optimization algorithm.

20. The method of modifying polygons in a mask data set according to claim 19, wherein a convex optimization process defines said optimization algorithm.

21. The method of modifying polygons in a mask data set according to claim 19, wherein a simulated annealing process defines said optimization algorithm.

22. The method of modifying polygons in a mask data set according to claim 19, wherein said optimization algorithm is a genetic algorithm.

23. A method of modifying polygons in a mask data set, comprising:
  moving at least one polygon edge in a set of mask layout polygons to reduce a measure of difference between a target pattern and a printed pattern as predicted by a computational model; and
  disrupting the integrity of said set of mask layout polygons to further help reduce said measure of difference.

24. The method of modifying polygons in a mask data set according to claim 23, wherein said step of disrupting includes allowing one or more polygons in said mask layout to merge.

25. The method of modifying polygons in a mask data set according to claim 23, wherein said step of disrupting includes allowing one or more polygons in said mask layout to become disjointed.

26. The method of modifying polygons in a mask data set according to claim 23, wherein said step of disrupting includes allowing one or more polygons in said mask layout to break apart to form a larger set of polygons.

27. The method of modifying polygons in a mask data set according to claim 23, wherein said step of step of disrupting includes allowing one or more polygons in said mask layout to be deleted to form a smaller set of polygons.

* * * * *